United States Patent [19]
Joo

[11] Patent Number: 6,071,787
[45] Date of Patent: Jun. 6, 2000

[54] METHOD OF FORMING A CAPACITOR INCLUDING FORMING A FIRST AND SECOND CONDUCTIVE LAYERS AND ETCHING LAYERS TO FORM ALLOYED CONDUCTIVE SIDEWALL SPACERS

[75] Inventor: Jae-Hyun Joo, Cheongju, Rep. of Korea

[73] Assignee: LG Semicon Co., Ltd., Cheongju, Rep. of Korea

[21] Appl. No.: 09/261,206

[22] Filed: Mar. 3, 1999

[30] Foreign Application Priority Data

Mar. 5, 1998 [KR] Rep. of Korea .......................... 98-7236

[51] Int. Cl.[7] .................................................. H01L 21/331
[52] U.S. Cl. ............................ 438/369; 438/253; 438/669
[58] Field of Search ............................... 438/3, 369, 608, 438/253, 396, 615, 669, FOR 212, FOR 220, FOR 430; 361/305, 321

[56] References Cited

U.S. PATENT DOCUMENTS

| | | | |
|---|---|---|---|
| 5,254,217 | 10/1993 | Maniar et al. | 438/608 |
| 5,443,688 | 8/1995 | Toure et al. | 438/3 |
| 5,479,317 | 12/1995 | Ramesh | 361/321 |
| 5,519,235 | 5/1996 | Ramesh | 257/295 |
| 5,790,366 | 8/1998 | Desu et al. | 361/305 |
| 5,825,609 | 10/1998 | Andricacos et al. | 361/321.4 |

*Primary Examiner*—Charles Bowers
*Assistant Examiner*—William M. Brewster
*Attorney, Agent, or Firm*—Fleshner & Kim, LLP

[57] ABSTRACT

A capacitor fabrication method for a semiconductor memory device, and in particular for a lower-portion electrode forming of a memory cell capacitor, wherein the entire effective area of the capacitor is extended by using a second conductive layer pattern as a mask and patterning an underlying first conductive layer which will be the lower-portion electrode. A mixed conductive material residue is generated in forming the lower-portion electrode and forms conductive residue sidewalls at the both sides of the lower-portion electrode.

18 Claims, 4 Drawing Sheets

BACLGROUND ART

METHOD OF FORMING A CAPACITOR INCLUDING FORMING A FIRST AND SECOND CONDUCTIVE LAYERS AND ETCHING LAYERS TO FORM ALLOYED CONDUCTIVE SIDEWALL SPACERS

BACKGROUND OF THE INVENTION

1. Field of the Invention

The present invention is directed to a capacitor fabrication method of a semiconductor device, and in particular to a lower-portion electrode forming method of a capacitor in a semiconductor memory cell.

2. Description of the Background Art

In general, a semiconductor memory device includes a transistor for driving a memory operation and a capacitor for storing information in the form of an electrical change. Methods for increasing the capacitance of a memory cell capacitor in a Dynamic Random Access Memory (DRAM) device include extending an effective surface area of the capacitor by fabricating the capacitor in a three-dimensional shape, reducing the thickness of a dielectric, or increasing the dielectric constant. As the degree of integration of the DRAM device is increased, the process for extending the surface area of the capacitor or reducing the thickness of the dielectric becomes complicated, and further the reliability of such a process also declines. Therefore, endeavors to increase the volume of the effective electric charge on the capacitor by utilizing a dielectric film with a high dielectric constant, such as $(Ba,Sr)TiO_3$ and $(Pb,La)(Zr,Ti)O_3$ have been recently made. When a dielectric film with a high dielectric constant such as BST is directly deposited on a silicone (Si) substrate, the silicone is oxidized, and thus an electrical contact can become defective, or the BST thin film may be deteriorated due to the reactivity between BST and Si. Accordingly, it is necessary to form a metal thin film (lower-portion electrode) such as Pt, Ru and Ir at a lower portion of the dielectric film with a high dielectric constant such as BST.

FIG. 1 is a cross-sectional view illustrating the constitution of a capacitor in a conventional semiconductor memory device. A barrier layer 13 is formed on a silicone substrate 11 where a contact plug 12 is formed. A lower-portion electrode 15 of a material such as Pt, Ru and Ir is formed on an upper portion of the barrier layer 13. A dielectric film with a high dielectric constant is formed on the silicone substrate 11 including the lower-portion electrode 15. In the case that such a dielectric film with a high dielectric constant as BST is used in the fabrication of the capacitor, a memory device having a degree of integration over the giga-level can be fabricated without a complicated three-dimensional configuration for extending an effective area of the capacitor.

A Pt thin film is characterized by low reactivity and large working function. Accordingly, the Pt thin film is popularly used as the lower-portion electrode 15 with the dielectric film. However, as illustrated in FIG. 2, when the lower-portion electrode 15 consisting of a Pt thin film is formed, in case etching of the Pt thin film by using a photoresist film mask or an oxide film mask 19 is performed in accordance with the conventional art, a polymer 21 is formed at both sides of the lower-portion electrode 15. The polymer 21 is mostly a mixed residue of Pt, C and O. When etching of the Pt thin film is performed, the photoresist film or the oxide film being a material of the mask 19 is mixed with the Pt thin film, and then the polymer 21 is deposited at the side portions of the lower-portion electrode 15. It is considerably difficult to remove the polymer 21. Besides, when the dielectric film is directly deposited on the polymer 21, carbon and the like included in the polymer 21 react with the dielectric film. Consequently, the electrical characteristics are deteriorated. Further, the polymer 21 is a non-conductor, and thus the side portions of the capacitor electrode cannot be utilized. Therefore, there is a disadvantage in that the effective area of the entire capacitor is reduced.

SUMMARY OF THE INVENTION

Accordingly, it is an object of the present invention to provide a capacitor fabrication method for extending an entire effective area of the capacitor by converting a (mixed) residue being generated when a lower-portion electrode is formed to a conductive material and forming the conductive mixed residue at both sides of the lower-portion electrode.

In order to achieve the afore-mentioned object, according to the present invention there is provided a capacitor fabrication method for a semiconductor memory device including: forming a first conductive layer at an upper portion of a semiconductor substrate where a contact plug is formed; forming a second conductive layer pattern on an upper portion of the first conductive layer; and forming a first conductive layer pattern by using the second conductive layer pattern as a mask and performing a patterning of the first conductive layer.

The surface area of the lower-portion electrode is controlled by partly or entirely removing the second conductive layer pattern.

The process of forming the second conductive layer pattern includes: forming the second conductive layer on an upper portion of the first conductive layer; forming a mask pattern on the second conductive layer; and patterning the second conductive layer by using the mask pattern.

The second conductive layer pattern consists of a material having a higher etching selectivity than the first conductive layer. For instance, the first conductive layer includes a Pt thin film and the second conductive layer pattern includes a Ru thin film or a $RuO_x$ film. Etching and patterning of the Ru thin film are performed by using a plasma including oxygen, and etching and patterning of the Pt thin film are performed by using a gas including Ar and $Cl_2$.

The mask pattern includes an oxide film or a photoresist film. Adhesion is improved by additionally forming an adhesive layer such as Ti and Ta between the oxide layer and the second conductive layer.

When etching and patterning of the first conductive layer is performed, conductive sidewalls consisting of a mixed residue of the first and second conductive layers is formed at both sides of the first and second conductive layer patterns.

A conductive oxide film can be additionally formed on the sidewalls and the second conductive layer pattern. The conductive oxide film is formed by a thermal treatment or a plasma treatment in an ambient containing oxygen.

The dielectric film consists of a material having the constitution of $ABO_3$(A=Pb, La, Ba, Sr or Li, B=Zr, Ti, Nb or Ta, O=oxygen).

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE INVENTION

The capacitor fabrication method for a semiconductor memory device in accordance with embodiments of the present invention will now be described in detail with reference to the accompanying drawings.

FIGS. 3(A) to 3(E) are sequential vertical-sectional views for explaining the capacitor fabrication method for a semiconductor memory device in accordance with a first embodiment of the present invention.

Figure 1:
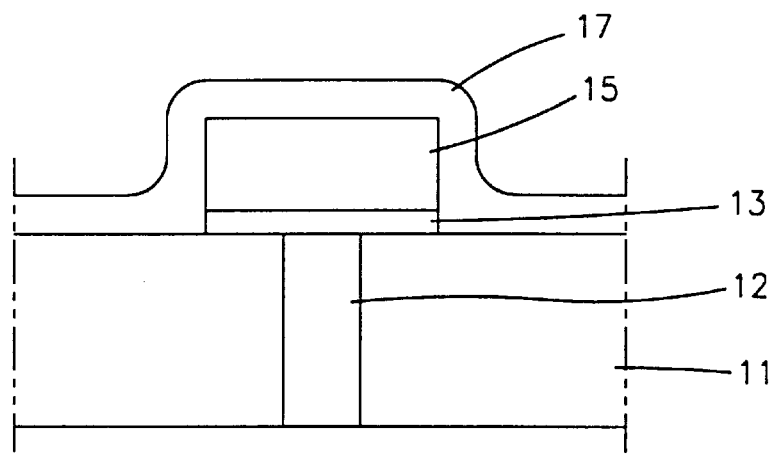
FIG. 1 is a cross-sectional view of a capacitor in a semiconductor device in accordance with a conventional art.
Figure 2:
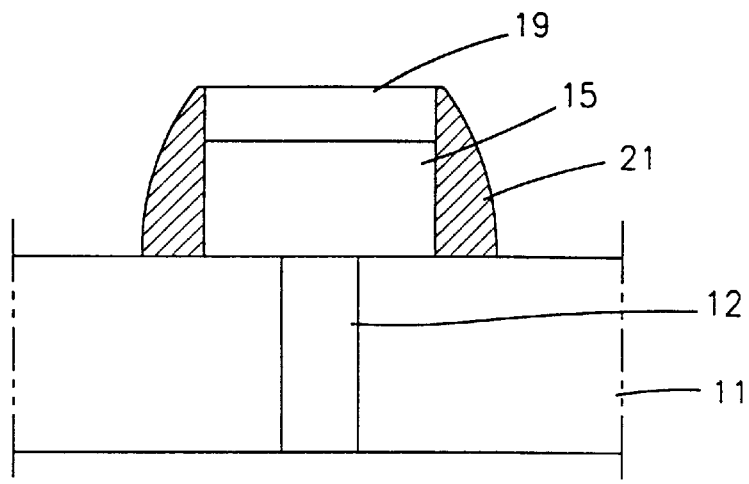
FIG. 2 illustrates a polymer generation in forming a lower-portion electrode of the capacitor in accordance with the conventional art.
Figure 3A:
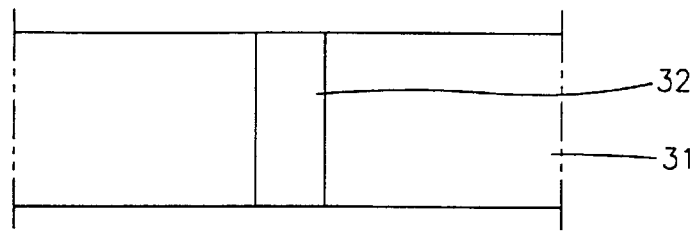
FIGS. 3(A) to 3(E) are sequential vertical-sectional views of a capacitor fabrication method for a semiconductor memory device in accordance with a first embodiment of the present invention.

First, as illustrated in FIG. 3(A), a contact plug 32 consisting of polysilicon or tungsten W is formed in a semiconductor substrate 31. The contact plug 32 is used for electrically connecting a driving transistor and capacitor of the semiconductor memory device.

Figure 3B:
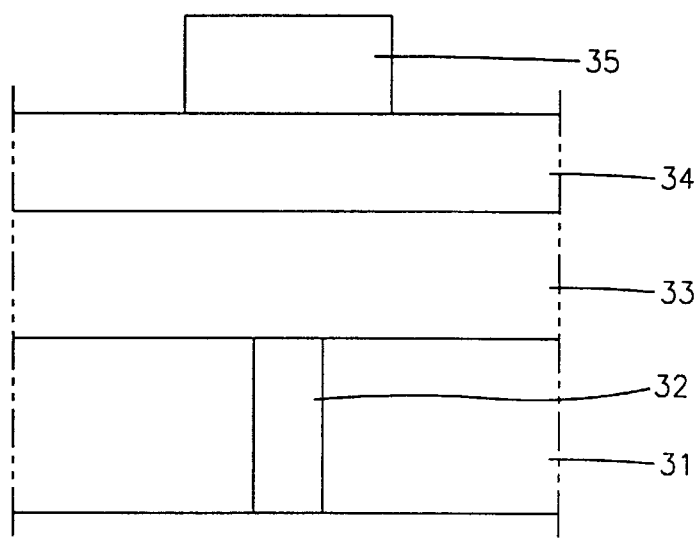

As shown in FIG. 3(B), a first conductive layer 33 and a second conductive layer 34 are sequentially formed on the semiconductor substrate 31 including the contact plug 32. Then, a mask pattern 35 is formed on the second conductive layer 34. The second conductive layer 34 consists of a material having a higher etching selectivity than the first conductive layer 33. For example, the first conductive layer 33 includes a Pt thin film and the second conductive layer 34 includes a Ru thin film or a $RuO_x$ thin film. In addition, the mask pattern 35 includes an oxide film or a photoresist film. In the case that the mask pattern 35 is formed with the oxide film, in order to improve adhesion of the layers, an adhesive layer (not illustrated) such as Ti or Ta is additionally formed between the oxide film and the second conductive layer 34.

Figure 3C:
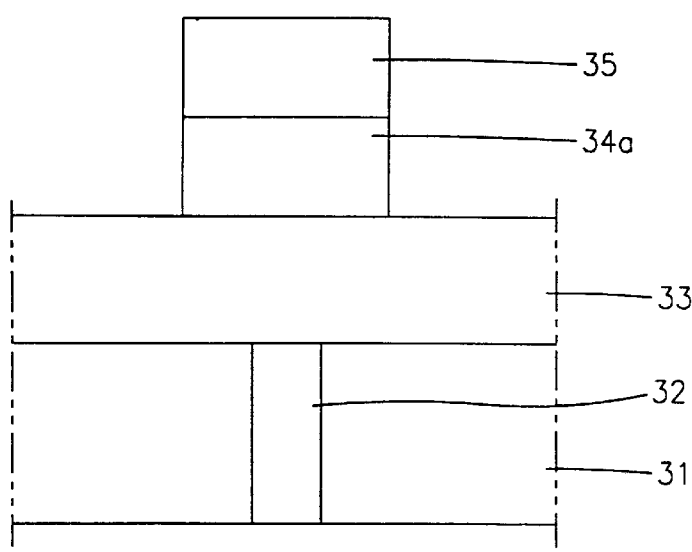

As illustrated in FIG. 3(C), a second conductive layer pattern 34a is formed by using the mask pattern 35 as a mask and performing a patterning of the second conductive layer 34. The second conductive layer pattern 34a is formed by a dry etching process using a plasma including oxygen as a reactivity source.

Figure 3D:
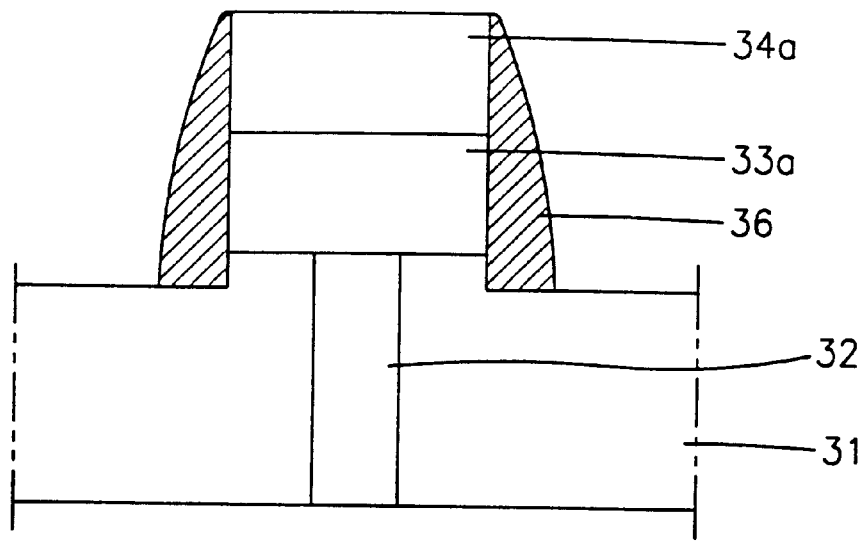

As shown in FIG. 3(D), after removing the mask pattern 35, a first conductive layer pattern 33a which will be a lower-portion electrode is formed by using the second conductive layer pattern 34a as a mask and a gas including Ar and $Cl_2$ as an etching gas and performing a patterning of the first conductive layer 33. The first conductive layer pattern 33a may also be formed by etching the first conductive layer 33 under the condition that the mask pattern 35 is not removed (not illustrated). When etching and patterning of the first conductive layer 33 is performed, an etching residue consisting of a compound of the first conductive layer 33 and the second conductive layer 34 is generated and the residue is formed into sidewalls 36 consisting of a conductive material at the both sides of the first conductive layer pattern 33a and the second conductive layer pattern 34a. That is, when the first conductive layer pattern 33a is formed with the Pt thin film and the second conductive layer pattern 34a is formed with the Ru thin film, the sidewalls 36 are formed of a Pt—Ru thin film being a compound metal of Pt and Ru.

Figure 3E:
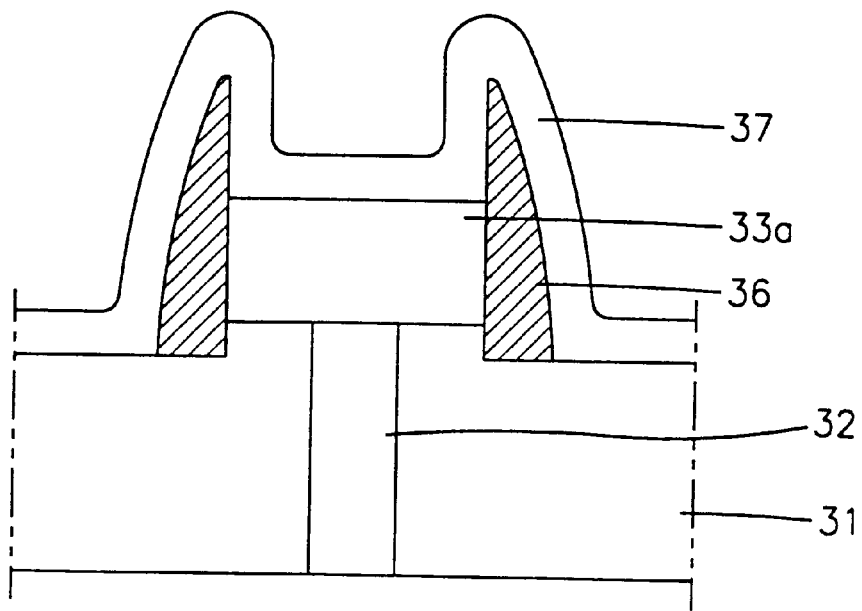

As illustrated in FIG. 3(E), the second conductive layer 34a is removed by a dry etching process, and then a dielectric film 37 is formed on the sidewalls 36 and at an upper portion of the first conductive layer pattern 33a. The dielectric film 37 consists of a material having the constitution of $ABO_3$(A=Pb, La, Ba, Sr or Li, B=Zr, Ti, Nb or Ta, O=oxygen). Etching of the second conductive layer pattern 34a is performed by using a plasma including oxygen as an etching gas.

Figure 4:
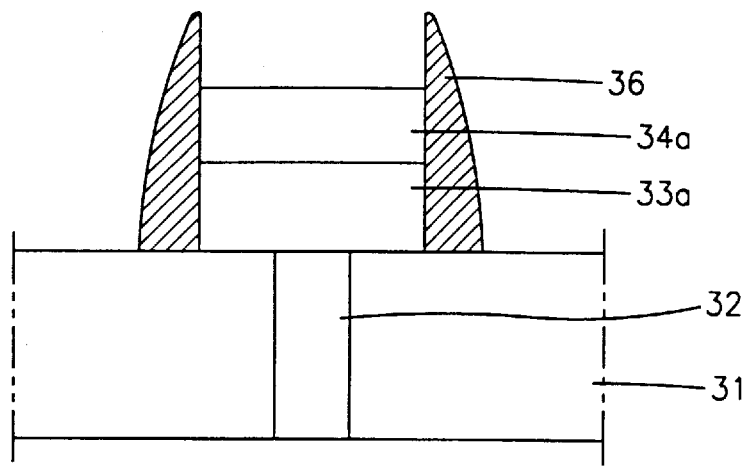
FIG. 4 is a vertical-sectional view of a capacitor fabricated by a method of a second embodiment in accordance with the present invention.

FIG. 4 is a vertical-sectional view illustrating the method according to a second embodiment of the present invention. The second conductive layer pattern 34a is only partly removed in FIG. 4, differently from the method in FIG. 3(D) in which the second conductive layer pattern 34a is entirely removed. The first conductive layer pattern 33a and the residual second conductive pattern 34a are used as the lower-portion electrode of the capacitor. The size of the effective surface area of the capacitor electrode can be controlled by such a constitution.

Figure 5:
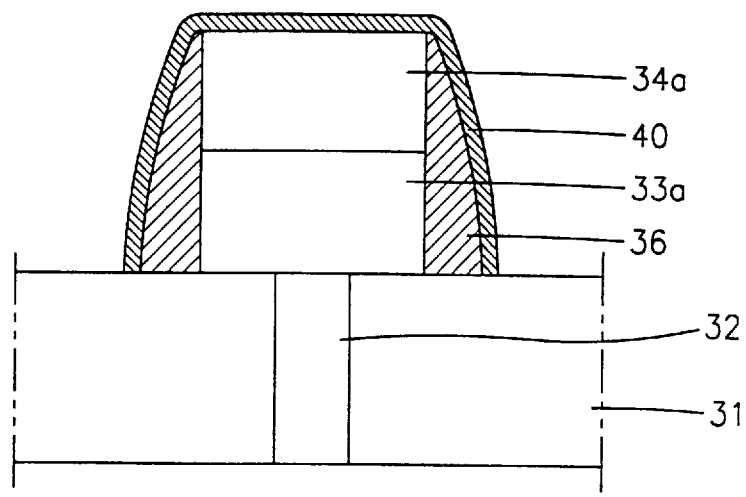
FIG. 5 is a vertical-sectional view of a capacitor fabricated by a method of a third embodiment in accordance with the present invention.

FIG. 5 is a vertical-sectional view illustrating the method according to a third embodiment of the present invention. As illustrated in FIG. 5, when the constitution shown in FIG. 3(D) is thermally-treated or plasma-treated, a conductive oxide film 40 is formed on the sidewalls 36 and on an upper portion of the second conductive layer pattern 34a. In the case that the first conductive layer pattern 33a is formed with the Pt thin film and the second conductive layer pattern 34a is formed with the Ru thin film, the sidewalls 36 are formed with a Pt—Ru thin film being a compound of Pt and Ru. Accordingly, the oxide conductive film is formed with Pt—Ru—O and RuO films, which serves as an interfacial protection film and prevents oxygen diffusion and electrical deterioration.

As described above in detail, in the capacitor fabrication method for a semiconductor memory device in accordance with the present invention, as compared with the conventional art, a process for removing a non-conductive residue formed being at the side portions of the lower-portion electrode is not demanded because the residue generated in performing a patterning of the first conductive layer and formed at the side portions of the lower-portion electrode becomes a conductive material. In addition, the effective area of the electrode can be extended by partly or entirely removing the second conductive layer pattern used as a mask in performing a patterning of the first conductive layer. Further, the oxygen diffusion can be efficiently prevented by forming the conductive oxide film on the surface of the lower-portion electrode by doing the thermal treatment or the plasma treatment of the conductive layer pattern which will be the lower-portion electrode in an ambient containing oxygen.

As the present invention may be embodied in several forms without departing from the spirit of essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the meets and bounds of the claims, or equivalences of such meets and bounds are therefore intended to be embraced by the appended claims.

What is claimed is:

1. A capacitor fabrication method for a semiconductor memory device, comprising:

forming a first conductive layer on a semiconductor substrate where a contact plug is formed;

forming a second conductive layer pattern on an upper portion of the first conductive layer; and forming a first conductive layer pattern by using the second conductive layer pattern as a mask for patterning the first conductive layer, wherein in patterning the first conductive layer, conductive sidewalls are formed at both sides of the first conductive layer pattern and the second conductive layer pattern, and wherein the sidewalls include an alloy of the first conductive layer and the second conductive layer.

2. The method of claim 1, further comprising: partly or entirely removing the second conductive layer pattern.

3. The method of claim 1, wherein the step of forming the second conductive layer pattern comprises: forming a mask pattern on the second conductive layer; and utilizing the mask pattern for performing a patterning of the second conductive layer.

4. The method of claim 3, wherein the second conductive layer pattern consists of a material having an etching selectivity higher than that of the first conductive layer.

5. The method of claim 4, wherein the first conductive layer includes a Pt thin film.

6. The method of claim 4, wherein the second conductive layer pattern includes a Ru thin film or a $RuO_x$ thin film.

7. The method of claim 1, wherein the mask pattern includes an oxide film or a photoresist film.

8. The method of claim 7, wherein an adhesive layer is additionally formed between the oxide layer and the second conductive layer.

9. The method of claim 8, wherein the adhesive layer includes at least one of Ti and Ta.

10. The method of claim 5, wherein etching and patterning of the Pt thin film is performed by a gas including at least one of Ar and $Cl_2$.

11. The method of claim 6, wherein etching and patterning of the Ru thin film are performed by a plasma including oxygen.

12. The method of claim 1, wherein an oxide conductive film is additionally formed on the conductive sidewalls and the second conductive layer pattern.

13. The method of claim 12, wherein the oxide conductive film is formed by thermally-treating or plasma treating the sidewalls and the second conductive layer pattern in an ambient containing oxygen.

14. The method of claim 1, wherein the compound includes Pt—Ru.

15. The method of claim 1, wherein a dielectric film is formed at an upper portion of the semiconductor substrate including the second conductive layer pattern and the conductive sidewalls.

16. The method of claim 15, wherein the dielectric film includes a material composed of $ABO_3$, where A is one of a group consisting of Pb, La, Ba, Sr and Li, B is one of a group consisting of Zr, Ti, Nb and Ta and where O is oxygen.

17. A capacitor fabrication method for a semiconductor memory device, comprising:

forming a first conductive layer on a semiconductor substrate where a contact plug is formed;

forming a second conductive layer pattern on an upper portion of the first conductive layer; and forming a first conductive layer pattern by using the second conductive layer pattern as a mask for patterning the first conductive layer, wherein in patterning the first conductive layer, conductive sidewalls are formed at both sides of the first conductive layer pattern and the second conductive layer pattern, and wherein etching and patterning of the first conductive layer is performed by a gas including at least one of Ar and $Cl_2$.

18. The method of claim 17, wherein the first conductive layer includes a Pt thin film.

* * * * *